(12) United States Patent
Kobayashi (10) Patent No.: US 10,698,036 B2
(45) Date of Patent: Jun. 30, 2020

(54) POWER STORAGE CELL CONTROL DEVICE AND POWER STORAGE MODULE MANAGEMENT SYSTEM

(71) Applicant: Panasonic Intellectual Property Management Co., Ltd., Osaka (JP)

(72) Inventor: Hitoshi Kobayashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 784 days.

(21) Appl. No.: 15/454,191

(22) Filed: Mar. 9, 2017

(65) Prior Publication Data

US 2017/0184683 A1 Jun. 29, 2017

Related U.S. Application Data

(63) Continuation of application No. PCT/JP2015/004582, filed on Sep. 9, 2015.

(30) Foreign Application Priority Data

Sep. 29, 2014 (JP) .................................. 2014-198575

(51) Int. Cl.

| | |
|---|---|
| *G01R 19/00* | (2006.01) |
| *G01R 31/396* | (2019.01) |
| *G01R 31/392* | (2019.01) |
| *H02J 7/00* | (2006.01) |

(Continued)

(52) U.S. Cl.
CPC ......... *G01R 31/396* (2019.01); *G01R 31/392* (2019.01); *H01M 10/425* (2013.01);

(Continued)

(58) Field of Classification Search
None
See application file for complete search history.

(56) References Cited

U.S. PATENT DOCUMENTS

| | | | | |
|---|---|---|---|---|
| 6,313,637 | B1 | 11/2001 | Iino et al. | |
| 8,723,527 | B2 * | 5/2014 | Kudo | B60L 50/51 |
| | | | | 324/433 |

(Continued)

FOREIGN PATENT DOCUMENTS

| | | |
|---|---|---|
| JP | 11-109005 | 4/1999 |
| JP | 11-160367 | 6/1999 |

(Continued)

OTHER PUBLICATIONS

International Search Report of PCT application No. PCT/JP2015/004582 dated Dec. 15, 2015.

*Primary Examiner* — Aditya S Bhat
(74) *Attorney, Agent, or Firm* — McDermott Will & Emery LLP (57) ABSTRACT

There are provided a plurality of first ADCs that respectively have voltages of a plurality of power storage cells of a power storage module as inputs. There are provided first reference voltage portions that are provided to respectively correspond to the first ADCs and supply reference voltages VRn used as a criterion for a conversion operation. A selector selects any one of the reference voltages VRn and supplies the selected reference voltage to a second ADC. A voltage value corrector corrects a voltage value of the power storage cell obtained by a voltage value acquirer on the basis of correction data obtained by using a digital signal output from the second ADC.

9 Claims, 7 Drawing Sheets

(51) Int. Cl.
*H02J 7/02* (2016.01)
*H01M 10/42* (2006.01)
*H01M 10/48* (2006.01)
*G01R 31/3835* (2019.01)

(52) U.S. Cl.
CPC ............ *H01M 10/482* (2013.01); *H02J 7/00* (2013.01); *H02J 7/02* (2013.01); *G01R 31/3835* (2019.01); *H01M 2010/4271* (2013.01); *H01M 2220/20* (2013.01)

(56) References Cited

U.S. PATENT DOCUMENTS 8,947,290 B2    2/2015   Miki et al.
2006/0007622 A1  1/2006  Furukawa et al.
2012/0296587 A1  11/2012 Sugiyama
2012/0326725 A1  12/2012 Sugeno et al.
2013/0057289 A1* 3/2013  Ishikawa ............ H01M 10/482
                                                    324/426
2013/0234720 A1  9/2013  Tanaka

FOREIGN PATENT DOCUMENTS

| | | |
|---|---|---|
| JP | 2002-156392 A | 5/2002 |
| JP | 2006-025501 | 1/2006 |
| JP | 2009-198448 | 9/2009 |
| JP | 2011-158268 | 8/2011 |
| JP | 2013-009514 | 1/2013 |
| JP | 2013-185904 | 9/2013 |
| WO | 2012/153372 | 11/2012 |

* cited by examiner

POWER STORAGE CELL CONTROL DEVICE AND POWER STORAGE MODULE MANAGEMENT SYSTEM

TECHNICAL FIELD

The present disclosure relates to a technique of measuring a voltage of a power storage cell with high accuracy in a power storage module in which a plurality of power storage cells are connected to each other.

BACKGROUND ART

In recent years, as power storage means for storing a large capacity of power, a power storage module in which a plurality of power storage cells are connected to each other has been used. For example, a battery module in which hundreds of lithium ion battery cells are connected in series to each other is mounted in an electric vehicle (EV) or a hybrid electric vehicle (HEV), and the battery module generates a voltage of hundreds of V so as to drive a motor.

In a power storage module, it is important to understand a state of charge (SOC) or a state of health (SOH) of a power storage cell with high accuracy. For example, in a case of an on-vehicle application, an SOC is understood with high accuracy, a cruising range of a vehicle can be increased by reducing a margin of residual quantity computation error for a charge amount, or mileage can be improved by reducing a battery weight through reduction of the number of serial connections or parallel connections of power storage cells mounted for a margin of error.

In order to understand an SOC or an SOH of power storage cells with high accuracy, it is preferable to measure voltages of a plurality of power storage cells and a current flowing therethrough at the same timing with high accuracy.

PTL 1 discloses a configuration of detecting a voltage of a battery module forming a battery for traveling as a vehicular power source device. In this configuration, battery cells of the battery module are sequentially selected by using a multiplexer, and a voltage value of a selected battery cell is measured by using an analog-to-digital converter (ADC).

CITATION LIST

Patent Literature

PTL 1: Japanese Patent Unexamined Publication No. 2006-25501

SUMMARY OF THE INVENTION

An object of the present disclosure is to provide a power storage cell control device which can measure voltages of a plurality of power storage cells in a power storage module at the same timing with high accuracy.

In an aspect of the present disclosure, there is provided a power storage cell control device which measures a voltage of each of a plurality of power storage cells with respect to a power storage module in which the plurality of power storage cells are connected to each other, the device including a plurality of first ADCs, a plurality of first reference voltage portions, a second ADC, a selector, a voltage value acquirer, and a voltage value corrector. Each of the plurality of first analog-to-digital converters (ADCs) has a voltage of each of the plurality of power storage cells of the power storage module as an input and outputs a first digital signal corresponding to the input. The plurality of first reference voltage portions are provided to respectively correspond to the plurality of first ADCs and supply reference voltages used as a criterion for a conversion operation of the plurality of first ADCs. The second ADC outputs a second digital signal corresponding to an input voltage. The second reference voltage portion supplies a reference voltage used as a criterion for a conversion operation of the second ADC. The selector selects a reference voltage supplied from any one of the plurality of first reference voltage portions, and supplies the selected reference voltage to the second ADC as the input voltage. The voltage value acquirer receives a plurality of first digital signals output from a group of the plurality of first ADCs, and obtains respective voltage values of the plurality of power storage cells on the basis of the plurality of first digital signals. The voltage value corrector receives a second digital signal output from the second ADC, and corrects the respective voltage values of the plurality of power storage cells obtained by the voltage value acquirer, on the basis of correction data obtained from the second digital signal.

According to the aspect, the first ADCs and the first reference voltage portions supplying reference voltages thereto are provided for at least two power storage cells of the power storage module, in order to measure voltages thereof. The voltage value acquirer obtains voltage values of the power storage cells on the basis of the first digital signals output from the first ADCs. The second ADC and the second reference voltage portion supplying a reference voltage thereto are provided to measure reference voltages supplied by the first reference voltage portions, and a reference voltage selected by the selector is supplied to the second ADC as an input. The voltage values of the power storage cells are corrected by the voltage value corrector on the basis of correction data obtained by using the second digital signal output from the second ADC. In other words, since a voltage of the power storage cell measured by the first ADC is corrected on the basis of a measured value of the reference voltage, a voltage of the power storage cell can be obtained with high accuracy even if a reference voltage supplied by the first reference voltage portion has very high accuracy. Since the first ADCs are respectively provided for a plurality of power storage cells, voltage measurement can be performed in parallel, for example, at the same timing. Since the second reference voltage portion may provide a highly accurate reference voltage in order to perform highly accurate measurement, according to the aspect, a circuit scale or the number of trimming work steps during shipment is not increased.

According to the present disclosure, in the power storage cell control device, it is possible to measure voltages of a plurality of power storage cells of the power storage module at the same timing with high accuracy without increasing a circuit scale or the number of work steps during shipment.

DESCRIPTION OF EMBODIMENT

Prior to description of an exemplary embodiment of the present disclosure, a problem of a device of the related art will be described briefly.

In the configuration disclosed in PTL 1, voltages of respective battery cells connected in series to each other are sequentially selected, and are measured by a common ADC. Thus, measurement errors among the battery cells can be reduced, and high measurement accuracy can be achieved by applying a high accurate voltage as a reference voltage for the ADC.

However, on the other hand, in the configuration disclosed in PTL 1, since the battery cells are sequentially selected, and a voltage is measured, it is hard to perform simultaneous measurement of cell voltages. Particularly, since it is necessary to increase a measurement time for each battery cell regardless of the type of ADC in order to perform highly accurate voltage measurement, in the configuration disclosed in PTL 1, it is harder to perform simultaneous measurement of cell voltages. Conversely, this hinders an SOC or an SOH of a power storage cell from being understood with high accuracy.

Hereinafter, an exemplary embodiment will be described with reference to the drawings. In the present specification, a power storage cell may be a cell having a function of storing power, and includes at least a battery cell and a capacitor cell.

Figure 1:
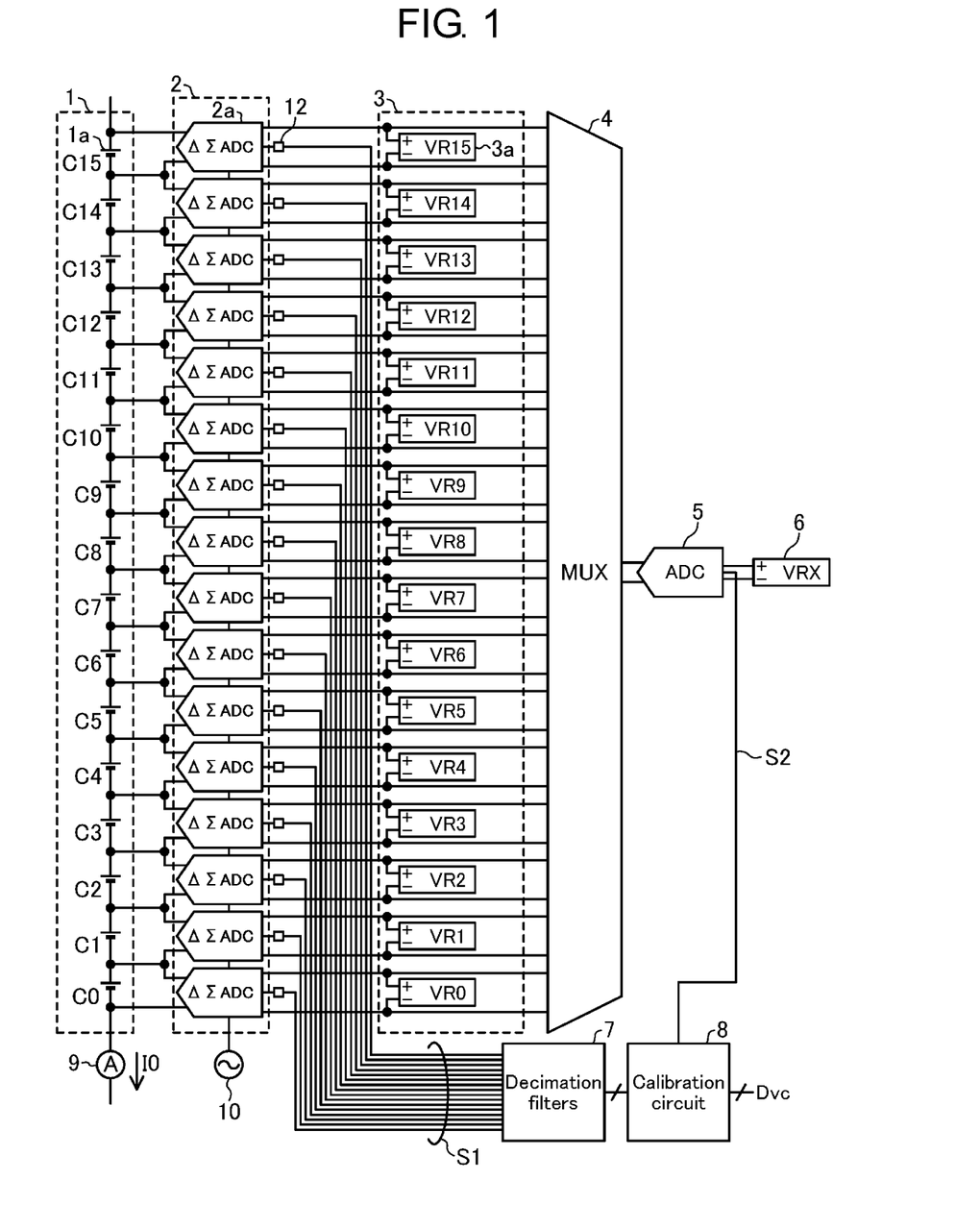
FIG. 1 is a schematic configuration diagram of a power storage cell control device according to an exemplary embodiment.

FIG. 1 is a diagram illustrating a schematic configuration of a power storage cell control device according to an exemplary embodiment. In FIG. 1, in power storage module 1, a plurality of power storage cells 1a (in FIG. 1, sixteen power storage cells C0 to C15) are connected in series to each other.

The power storage cell control device has a function of measuring a voltage of each of power storage cells 1a in power storage module 1. In the present exemplary embodiment, it is assumed that a lithium ion battery cell is used as power storage cell 1a. However, the present exemplary embodiment is applicable to other kinds of power storage cells.

The power storage cell control device includes ADC group 2 formed of a plurality of first analog-to-digital converters (ADC) 2a, reference voltage portion group 3 formed of a plurality of first reference voltage portions 3a which are respectively provided to correspond to first ADCs 2a, multiplexer 4 as a selector, and second ADC 5. The power storage cell control device also includes second reference voltage portion 6 which supplies reference potentials VRX+ and VRX− used as a criterion for a conversion operation of second ADC 5, decimation filter 7 forming a voltage value acquirer, and calibration circuit 8 forming voltage value corrector. Here, second reference voltage portion 6 is formed of a band gap circuit, a zener diode, or the like, and is adjusted (trimmed) during shipment inspection so as to supply a highly accurate absolute voltage criterion. Ammeter 9 measures current IO flowing through power storage module 1.

Each of first ADCs 2a of ADC group 2 has a voltage of each of power storage cells 1a as an input in power storage module 1, and outputs first digital signal S1 corresponding to the input. In the configuration illustrated in FIG. 1, first ADC 2a is a delta-sigma type ADC, and first digital signal S1 which is an output thereof is a pulse density modulation (PDM) signal of 1 bit or a plurality of bits. Decimation filter 7 obtains a digital value indicating a voltage of power storage cell 1a on the basis of first digital signal S1 which is a PDM signal. A voltage level of a signal output from each first ADC 2a is a voltage level of both ends of corresponding power storage cell 1a, and thus signal output lines of respective first ADCs 2a are provided with level shifters 12 for matching voltage levels of first digital signals S1 with each other. In the present exemplary embodiment, a common clock signal generated by clock generator 10 is supplied to respective first ADCs 2a which are thus operated in synchronization with the common clock signal.

Each first reference voltage portion 3a of reference voltage portion group 3 supplies reference potentials VRn+ and VRn− (where n is 0 to 15) used as a criterion for a conversion operation to corresponding first ADC 2a. Potential differences between the reference potentials VRn+ and VRn− corresponding to respective first ADCs 2a are the same as each other, but voltage levels thereof are set to correspond to voltage levels of anodes of respective power storage cells 1a (or voltage levels thereof are set to correspond to voltage levels of power storage cells 1a). There may be various methods of supplying reference potentials VRn+ and VRn−, and, here, it is assumed that a reference voltage supplied by second reference voltage portion 6 is transmitted through current and voltage conversion.

Figure 2:
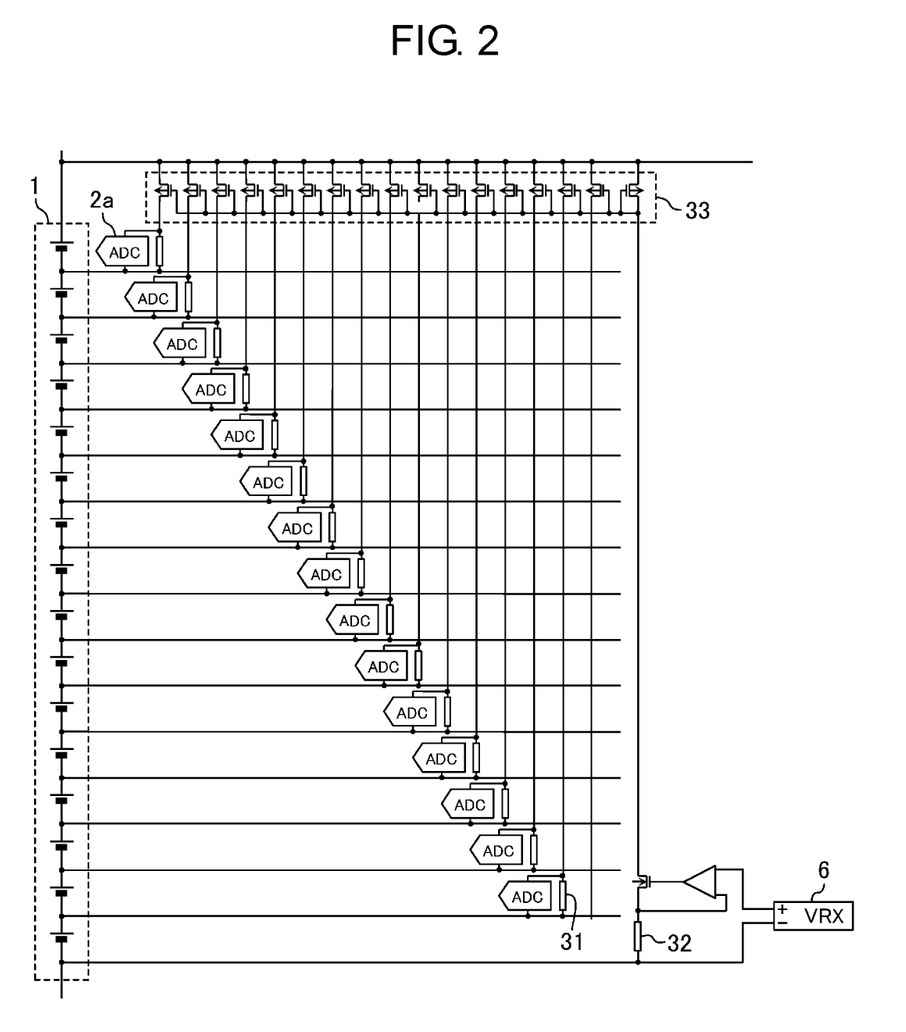
FIG. 2 is a circuit diagram illustrating a configuration example of a reference voltage portion group in FIG. 1.

FIG. 2 illustrates a configuration example of reference voltage portion group 3. In FIG. 2, each ADC 2a is provided with first reference resistor 31 for supplying reference potentials VRn+ and VRn−. A current is generated by using a highly accurate reference voltage supplied by second reference voltage portion 6 and second reference resistor 32, and the current is distributed via current mirror circuit 33 so as to flow through each first reference resistor 31. Consequently, reference potentials VRn+ and VRn− are generated at both ends of first reference resistor 31.

Figure 3:
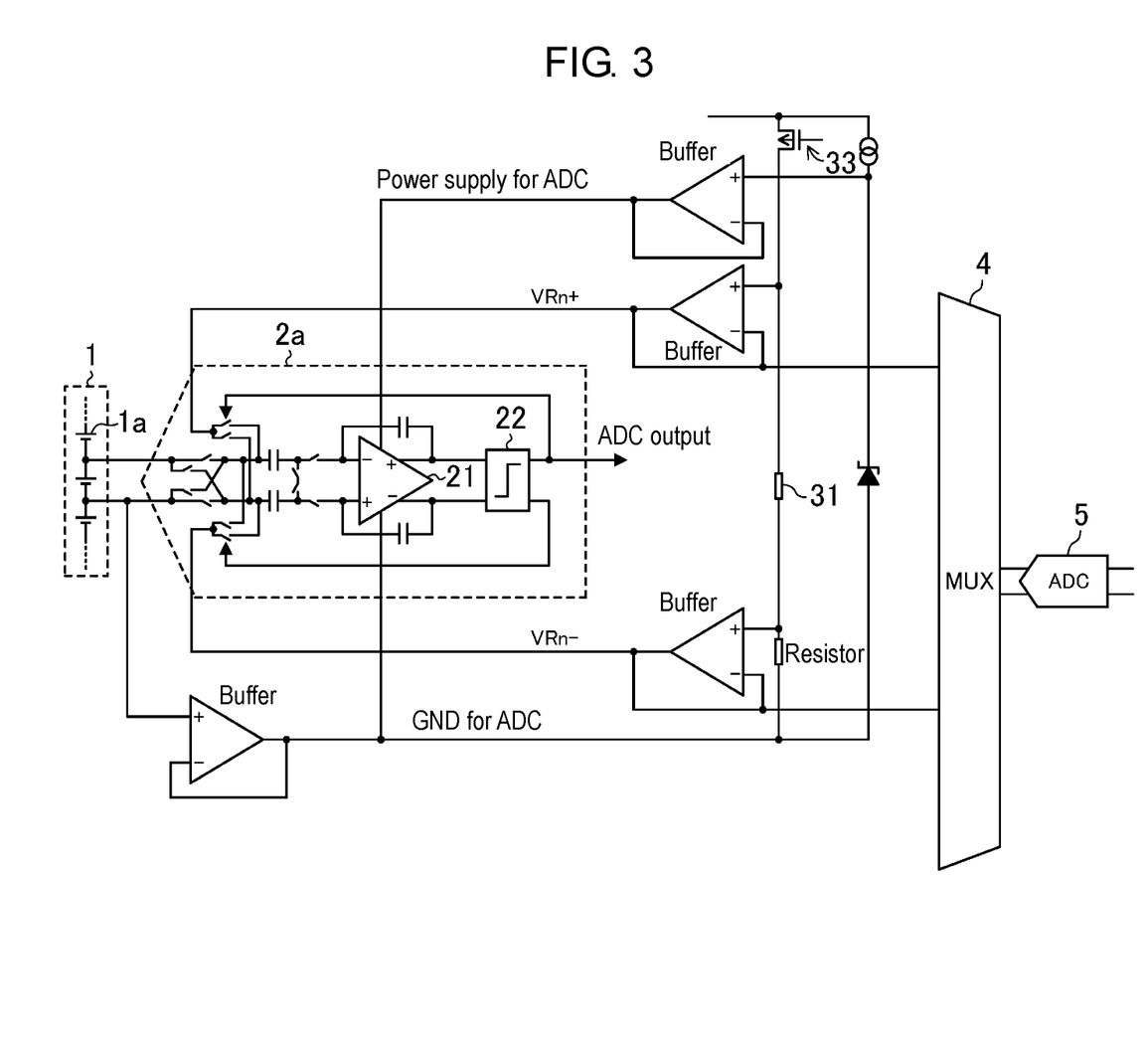
FIG. 3 is a circuit diagram illustrating a circuit configuration example of a first ADC and a periphery thereof.

FIG. 3 illustrates a circuit configuration example of first ADC 2a and a periphery thereof. In FIG. 3, first ADC 2a is a linear delta-sigma type ADC, and includes operational amplifier 21 and quantizer 22. As described in FIG. 2, currents as distribution results obtained by using current mirror circuit 33 flow through first reference resistors 31, and thus reference potentials VRn+ and VRn− are generated so as to be supplied to first ADCs 2a.

In the configurations illustrated in FIGS. 2 and 3, it is hard to obtain highly accurate reference potentials VRn+ and VRn− due to mismatching between first reference resistor 31 and second reference resistor 32 or an error of a current mirror ratio for distributing a current. For example, there may be a method of generating reference potentials VRn+ and VRn− by performing electric charge transmission by using a flying capacitor, but an error inevitably occurs due to mismatching between capacities. However, in the present exemplary embodiment, as will be described later, a voltage measured by first ADC 2a is corrected on the basis of measured values of reference potentials VRn+ and VRn−, and thus a voltage of power storage cell 1a can be obtained with high accuracy even if reference potentials VRn+ and VRn− do not have very high accuracy.

Referring to FIG. 1 again, multiplexer 4 selects reference potentials VRn+ and VRn− supplied by any one of respective first reference voltage portions 3a of reference voltage portion group 3, and supplies reference potentials VRn+ and VRn− to second ADC 5 as an input voltage. Second ADC 5 performs a conversion operation by using highly accurate reference potentials VRX+ and VRX− supplied from second reference voltage portion 6 as a criterion, and outputs second digital signal S2 corresponding to the input voltage. In other words, second digital signal S2 indicates differences between selected reference potentials VRn+ and VRn− and highly accurate reference potentials VRX+ and VRX−.

Calibration circuit 8 receives second digital signal S2 output from second ADC 5, and corrects a voltage value of power storage cell 1a obtained by decimation filter 7 on the basis of correction data obtained from second digital signal S2. For example, calibration circuit 8 obtains a potential difference between reference potentials VRn+ and VRn− selected by multiplexer 4 on the basis of second digital signal S2. The correction data is obtained on the basis of a difference between the potential difference and a potential difference between highly accurate reference potentials VRX+ and VRX− stored in advance, and is stored. In other words, calibration circuit 8 stores correction data corresponding to each first reference voltage portion 3a. The voltage value of power storage cell 1a output from decimation filter 7 is corrected by using the stored correction data.

Here, in voltage measurement using the ADC, one of the most important factors for obtaining high measurement accuracy is the accuracy of a reference voltage used as a criterion for an AD conversion operation. For example, in a case of a lithium ion battery, in order to accurately understand deterioration in a cell, it is necessary to detect a fine voltage reduction of, for example, about 3 to 10 mV from a normal voltage, for example, 3.4 V. Thus, a reference voltage for the ADC requires a highly accurate absolute voltage criterion having the accuracy of 2 to 10 ppm/° C. in terms of temperature stability and 0.02 to 0.1% in terms of absolute voltage error.

However, such a configuration of supplying a highly accurate reference voltage is realized by a band gap circuit, a zener diode, or the like, and thus occupies a large circuit area. Trimming is necessary during shipment inspection. Thus, for example, in the configuration illustrated in FIG. 1, if a constituent element supplying a highly accurate reference voltage, such as second reference voltage portion 6, is provided for each of the plurality of first ADCs 2a, a circuit area is considerably increased. Trimming is necessary for each of the constituent elements supplying a highly accurate reference voltage during shipment inspection, and thus a large number of work steps are necessary during shipment.

In contrast, according to the configuration of the present exemplary embodiment, even if the accuracy of reference potentials VRn+ and VRn− supplied by first reference voltage portion 3a is not necessarily high, a correction process is performed on a voltage of power storage cell 1a on the basis of highly accurate reference potentials VRX+ and VRX−, and thus it is possible to acquire a highly accurate value. Consequently, for example, a simple configuration illustrated in FIG. 2 can be employed in first reference voltage portion 3a, and thus it is possible to prevent an increase in a circuit area or the number of work steps during shipment.

Figure 4:
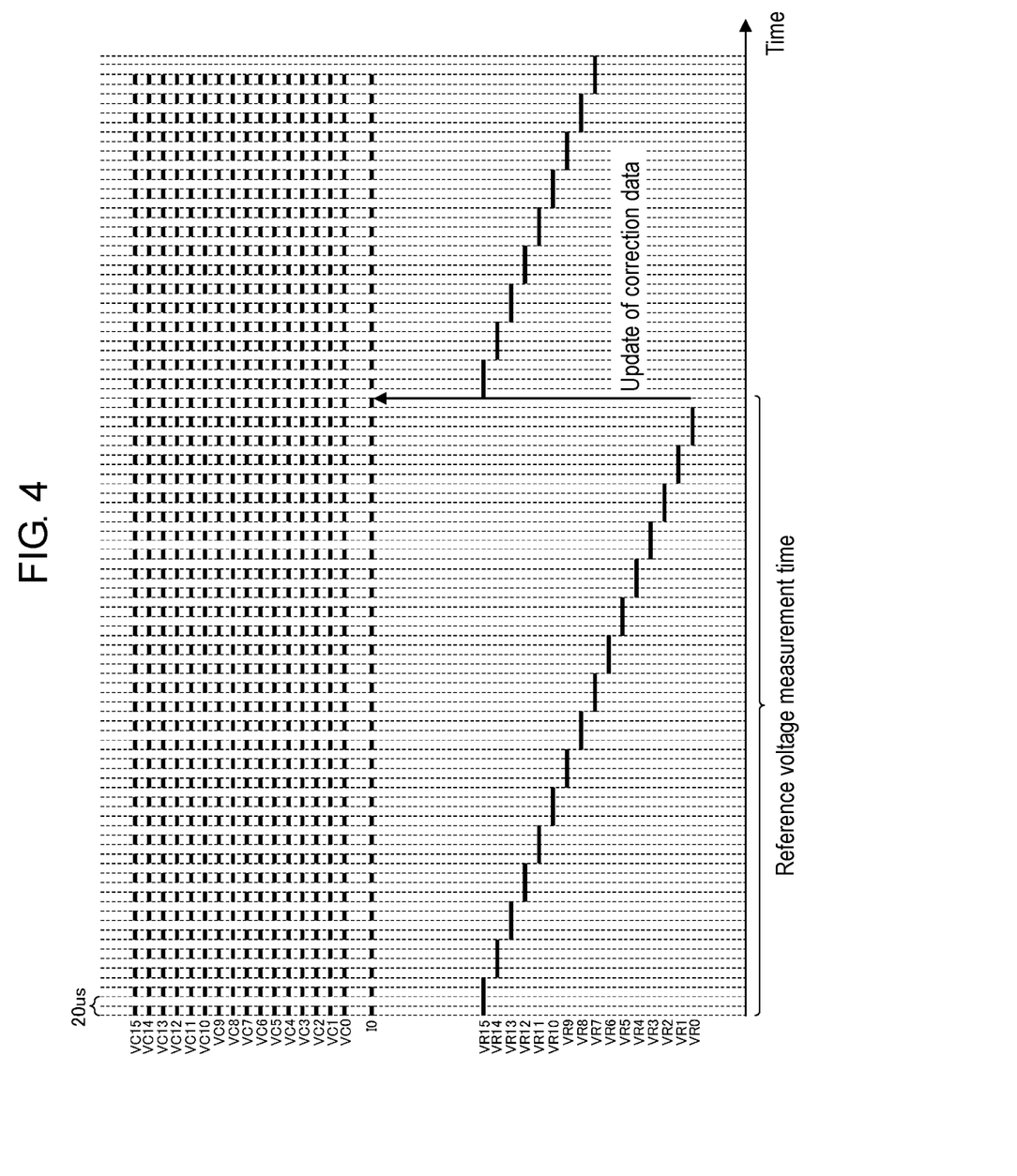
FIG. 4 is a timing chart illustrating an operation example of the power storage cell control device according to the exemplary embodiment.

FIG. 4 is a timing chart illustrating an example of an operation of the power storage cell control device according to the present exemplary embodiment. In FIG. 4, VC0 to VC15 indicate voltages of respective power storage cells C0 to C15, and are measured by ADC group 2. I0 indicates a current flowing through power storage module 1, and is measured by ammeter 9. VR0 to VR15 indicate reference voltages for respective first ADCs 2a, and are measured by second ADC 5.

In the operation illustrated in FIG. 4, voltages VC0 to VC15 of respective power storage cells C0 to C15 and current I0 in power storage module 1 are measured in a cycle of, for example, 20 μs. Voltages VC0 to VC15 are corrected by calibration circuit 8. On the other hand, reference voltages VR0 to VR15 for first ADCs 2a are selected by multiplexer 4 in a cycle of, for example, 40 μs in a predetermined order, so as to be measured. Multiplexer 4 repeatedly performs this selection operation. Calibration circuit 8 updates correction data in the measurement cycle of reference voltages VR0 to VR15 for first ADCs 2a. Thereafter, voltages VC0 to VC15 are corrected on the basis of updated correction data.

Here, in order to perform highly accurate correction, measurement of reference voltages VR0 to VR15 is required to be performed in a cycle which is sufficiently shorter than a period of time in which reference voltages VR0 to VR15 change due to the influence of an environmental temperature or the like. However, the change in an environmental temperature is smooth relative to the measurement cycle of voltages of power storage cells C0 to C15, and reference voltages VR0 to VR15 do not change suddenly. Reference voltages VR0 to VR15 is DC voltages with less disturbance noise unlike voltages of power storage cells 1a. Thus, it is possible to measure reference voltages VR0 to VR15 for a sufficient time by reducing a cyclic rate of multiplexer 4. Consequently, for example, second ADC 5 has a high over-sampling rate, and thus it is possible to realize high resolution measurement.

As mentioned above, according to the present exemplary embodiment, reference potentials VRn+ and VRn− for first ADC 2a having a voltage of power storage cell 1a as an input are measured by second ADC 5 which performs a conversion operation by using highly accurate reference potentials VRX+ and VRX− as a criterion. Decimation filter 7 generates a voltage value of power storage cell 1a on the basis of first digital signal S1 output from first ADC 2a, and calibration circuit 8 corrects the voltage value by using correction data obtained from second digital signal S2 output from second ADC 5. Consequently, voltages of power storage cells 1a can be measured with the accuracy of highly accurate reference potentials VRX+ and VRX−, and thus it is possible to minimize an error between voltage values of power storage cells 1a.

According to the present exemplary embodiment, a plurality of first ADCs 2a are provided to respectively correspond to power storage cells 1a, and are operated in synchronization with the common clock signal, and thus it is possible to measure voltages of respective power storage cells 1a at the same timing. Consequently, it is possible to measure a highly accurate SOC, SOH, or the like.

According to the present exemplary embodiment, since a measured value of a voltage of power storage cell 1a is corrected to the accuracy of highly accurate reference potentials VRX+ and VRX− by calibration circuit 8, first reference voltage portion 3a can be formed of a relatively simple circuit. A circuit supplying a highly accurate absolute voltage criterion may be provided as first reference voltage portion 3a in the same manner as second reference voltage portion 6, but, in this case, a circuit area increases, and the number of trimming steps also considerably increases during shipment inspection. In other words, according to the present exemplary embodiment, it is possible to measure a voltage of each power storage cell 1a with high accuracy while reducing a circuit area or the number of trimming steps.

Here, a supplementary description will be made of usefulness of an on-vehicle application in the present exemplary embodiment.

As described in Background Art, it is important to understand an SOC or an SOH of a power storage cell with high accuracy with respect to a power storage module. For example, an output power value, that is, a state of power (SOP) which is extracted from the power storage module can be obtained on the basis of an acquired SOC or SOH.

On the other hand, the SOC has a linear correlation with an open voltage called an open circuit voltage (OCV), that is, a cell stable voltage in a state in which a current does not flow. Thus, if the OCV can be detected, the SOC can be relatively easily obtained.

However, there is little chance to obtain the OCV in an on-vehicle power storage module. In other words, when a vehicle is traveling, discharging during motor driving and regeneration during braking are repeatedly performed, and, in a hybrid car, charging is performed by an alternator even during temporary stop, and thus a current substantially normally flows through the power storage module. Even in parking, there is a case where time of several tens of hours or more is required until the influence of polarization added during traveling is removed, and a cell voltage converges on a voltage value regarded as the OCV. There are many cases where rebalancing between power storage cells connected in series is performed even in parking, and a current flows through the power storage cells during rebalancing.

In the power storage cell control device according to the present exemplary embodiment, a current flowing through the power storage module and a voltage of the power storage cell can be measured at the same timing, and thus the SOC can be computed on the basis of values thereof. Therefore, it is possible to understand a highly accurate SOC even with respect to a power storage module for an on-vehicle apparatus in which it is hard to obtain an OCV.

Figure 5:
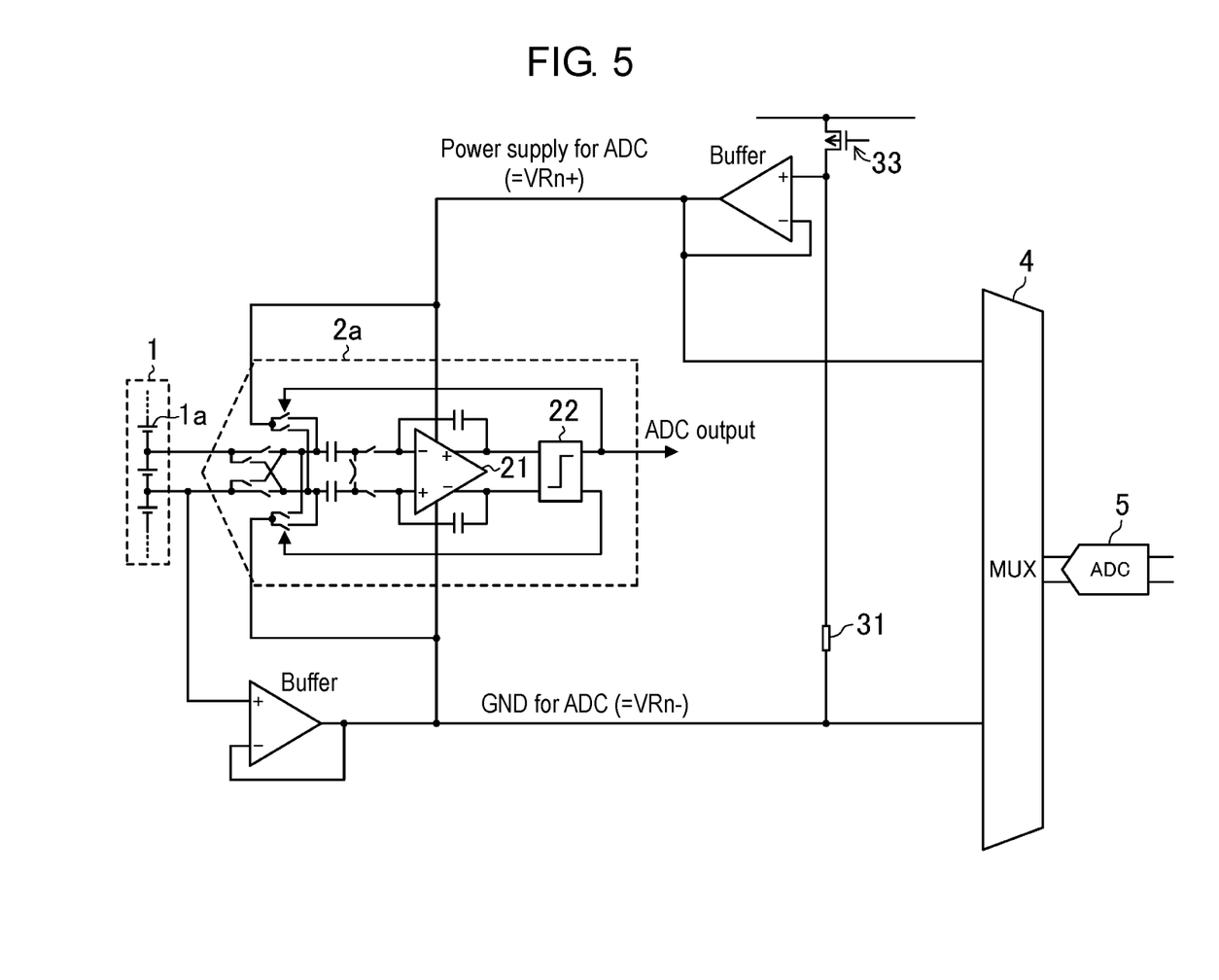
FIG. 5 is a circuit diagram illustrating another circuit configuration example of the first ADC and the periphery thereof in FIG. 1.

First reference voltage portion 3a may supply a power supply voltage and a ground voltage (GND voltage) to corresponding first ADC 2a as reference potentials VRn+ and VRn−. FIG. 5 illustrates another circuit configuration example of first ADC 2a and a periphery thereof, and illustrates a configuration in which a power supply voltage and a GND voltage for first ADC 2a are also used as reference potentials VRn+ and VRn−. In the following drawings, a repeated description of the substantially same portions as in FIGS. 1 and 2 will be omitted in some cases. As illustrated in FIG. 5, currents obtained as results of distribution using current mirror circuit 33 flow through first reference resistors 31, and thus a power supply voltage (reference potential VRn+) and a GND voltage (=reference potential VRn−) for first ADC 2a so as to be supplied to first ADC 2a. Multiplexer 4 supplies the power supply voltage and the GND voltage for first ADC 2a to second ADC 5 as inputs.

Figure 6:
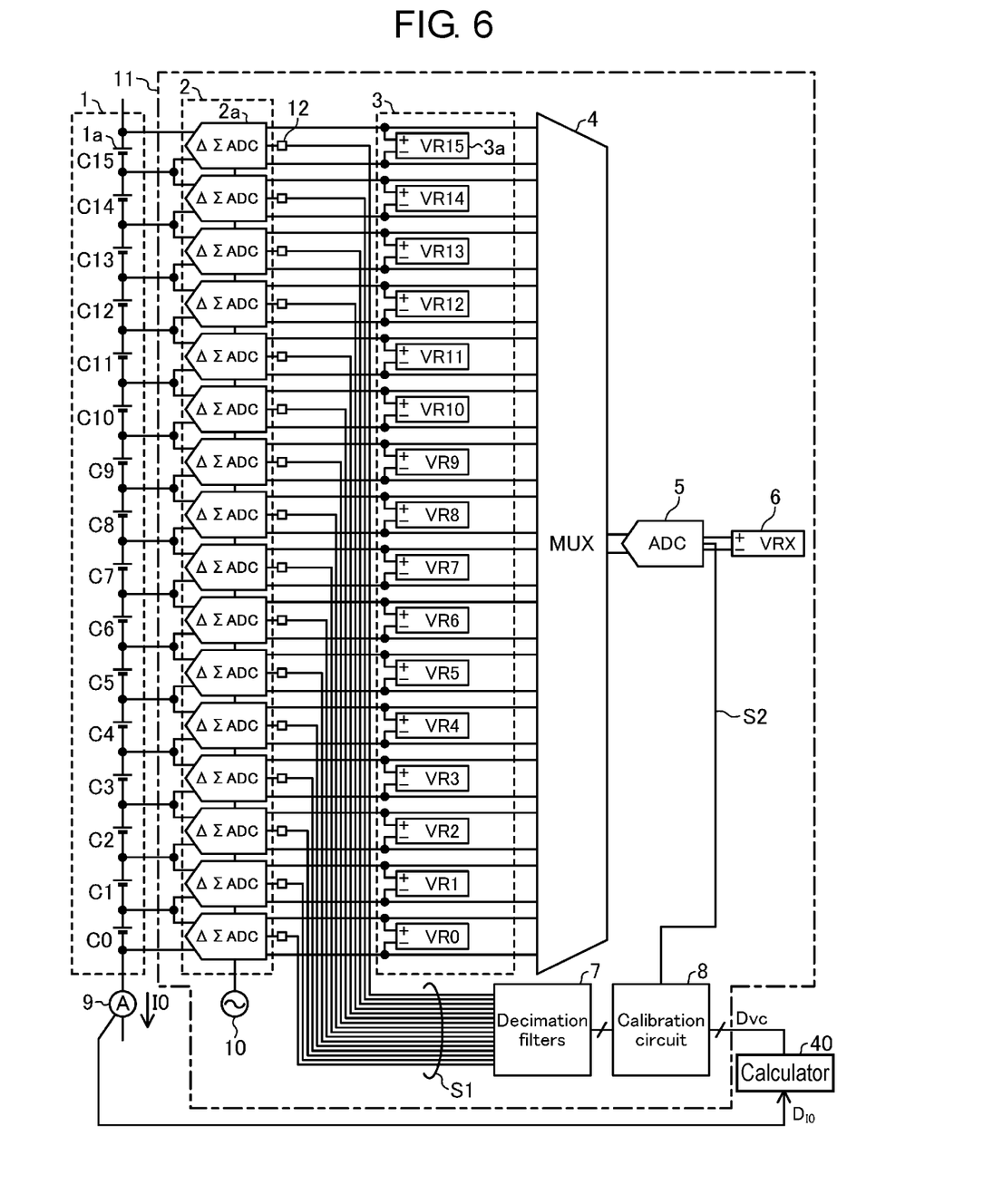
FIG. 6 is a circuit diagram illustrating a system configuration example including the power storage cell control device according to the exemplary embodiment.

FIG. 6 illustrates a configuration example of a power storage module management system including the power storage cell control device illustrated in FIG. 1. In the system configuration illustrated in FIG. 6, ADC group 2, reference voltage portion group 3, multiplexer 4, second ADC 5, second reference voltage portion 6, decimation filter 7, calibration circuit 8, and the like are mounted on single semiconductor device 11. Calculator 40 performs calculation of obtaining, for example, an SOC or an SOH on the basis of voltage value Dvc output from semiconductor device 11 and current value Di0 obtained from ammeter 9.

In the above-described present exemplary embodiment, a delta-sigma type ADC is employed as first ADC 2a. In a case of the present exemplary embodiment, since continuous conversion operations can be performed, a high over-sampling rate can be taken, and a specification required for an anti-aliasing filter can be lowered by reducing the order of a delta-sigma modulator to be used. Since a PDM signal of 1 bit or a plurality of bits is output, the number of digital signal up to decimation filter 7 in the subsequent stage can be reduced, and thus the number of level shifters 12 required for connection can be reduced.

ADCs of types other than the delta-sigma type may be used as first ADC 2a. For example, in a case where an incremental type ADC is used, it is possible to achieve the same effect as in the delta-sigma type. For example, a successive approximation register (SAR; successive comparison) type ADC, a cyclic type ADC, and a slope type ADC may be used.

Figure 7:
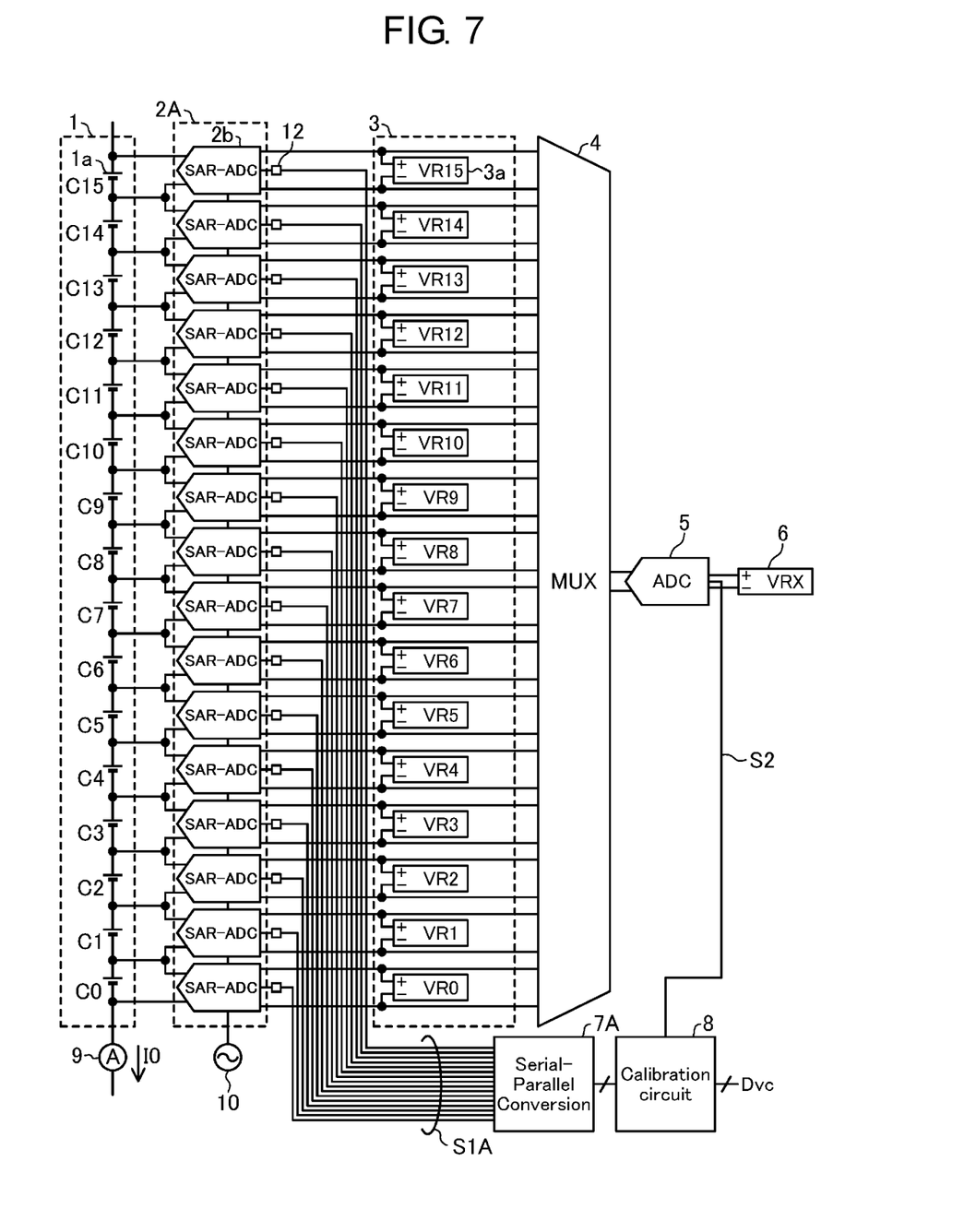
FIG. 7 is a circuit diagram illustrating another configuration example of the power storage cell control device according to the exemplary embodiment.

FIG. 7 illustrates another configuration example of the power storage cell control device according to the exemplary embodiment, and a SAR type ADC is used as first ADC 2b forming ADC group 2A. Instead of decimation filter 7, serial-parallel conversion circuit 7A having digital signal S1A output from ADC 2b as an input is provided as a voltage value acquirer. In the SAR type ADC, a digital value of an output signal is directly serially output, and thus the number of level shifters 12 required for connection to the subsequent stage can be reduced. The same effect can also be achieved in a cyclic type ADC or a slope type ADC.

In the present exemplary embodiment, first ADC 2a or 2b is provided for each power storage cell 1a in power storage module 1, but any other configuration may be employed. In other words, the present exemplary embodiment may be applied to some of power storage cells 1a of power storage module 1.

INDUSTRIAL APPLICABILITY

The power storage cell control device according to the present disclosure can measure voltages of a plurality of power storage cells in a power storage module at the same timing with high accuracy without increasing a circuit scale or the number of work steps during shipment, and is thus useful for reducing cost of, for example, an on-vehicle battery management system or improving accuracy.

REFERENCE MARKS IN THE DRAWINGS 1 power storage module
1a power storage cell
2, 2A ADC group
2a, 2b first ADC
3 reference voltage portion group
3a first reference voltage portion
4 multiplexer (selector)
5 second ADC
6 second reference voltage portion
7 decimation filter (voltage value acquirer)
7A serial-parallel conversion circuit (voltage value acquirer)
8 calibration circuit (voltage value corrector)
9 ammeter
11 semiconductor device
40 calculator S1 first digital signal
S2 second digital signal
VRn+, VRn− (where n is an integer), VRX+, VRX− reference potential

The invention claimed is:

1. A power storage cell control device which measures a voltage of each of a plurality of power storage cells with respect to a power storage module in which the plurality of power storage cells are connected to each other, the device comprising:
   a plurality of first analog-to-digital converters (ADCs) each of which has a voltage of a different one of the plurality of power storage cells of the power storage module as an input and outputs a first digital signal corresponding to the input;
   a plurality of first reference voltage portions that are provided to respectively correspond to the plurality of first ADCs and supply reference voltages used as a criterion for a conversion operation of the plurality of first ADCs;
   a second ADC that outputs a second digital signal corresponding to an input voltage;
   a second reference voltage portion that supplies a reference voltage used as a criterion for a conversion operation of the second ADC;
   a selector that selects a reference voltage supplied from any one of the plurality of first reference voltage portions, and supplies the selected reference voltage to the second ADC as the input voltage;
   a voltage value acquirer that receives a plurality of first digital signals output from a group of the plurality of first ADCs, and obtains respective voltage values of the plurality of power storage cells on the basis of the plurality of first digital signals; and
   a voltage value corrector that receives a second digital signal output from the second ADC, and corrects the respective voltage values of the plurality of power storage cells obtained by the voltage value acquirer, on the basis of correction data obtained from the second digital signal.

2. The power storage cell control device of claim 1, wherein the selector performs an operation of selecting the reference voltages in a cycle which is equal to or higher than a measurement cycle for the plurality of first ADCs.

3. The power storage cell control device of claim 1, wherein the plurality of first ADCs receive a common clock signal, and are operated in synchronization with the common clock signal.

4. The power storage cell control device of claim 1, wherein the selector selects, in a predetermined order, the reference voltages supplied from the plurality of first reference voltage portions, and repeatedly performs the operation of selecting the reference voltages, and
wherein the voltage value corrector stores correction data corresponding to each of the plurality of first reference voltage portions, and updates the stored correction data on the basis of the second digital signal when the second digital signal is received from the second ADC.

5. The power storage cell control device of claim 1,
wherein the plurality of first reference voltage portions supply power supply voltages and ground voltages for the plurality of corresponding first ADCs as the reference voltages.

6. The power storage cell control device of claim 1,
wherein the plurality of first ADCs, the plurality of first reference voltage portions, the second ADC, the second reference voltage portion, the selector, the voltage value acquirer, and the voltage value corrector are mounted on a single semiconductor device.

7. The power storage cell control device of claim 1,
wherein the plurality of first ADCs are delta-sigma type or incremental type ADCs, and output the first digital signals in a format of pulse density modulation (PDM) signals, and
wherein the voltage value acquirer includes a decimation filter that complements digital values with the PDM signals.

8. The power storage cell control device of claim 1,
wherein the plurality of first ADCs are successive comparison type, cyclic type, or slope type ADCs, and output the first digital signals as serial signals, and
wherein the voltage value acquirer includes a serial-parallel conversion circuit that converts the serial signals into parallel signals.

9. A power storage module management system comprising:
   the power storage cell control device of claim 1;
   an ammeter that measures a current flowing through the power storage module; and
   a calculator that calculates a state of charge (SOC) or a state of health (SOH) of the plurality of power storage cells by using a current value measured by the ammeter and voltage values of the plurality of power storage cells output from the power storage cell control device.

* * * * *